United States Patent
Seo et al.

(10) Patent No.: US 9,986,184 B2
(45) Date of Patent: May 29, 2018

(54) IMAGE SENSOR INCLUDING PHASE DIFFERENCE DETECTION PIXELS HAVING AUTO FOCUS ACCURACY BASED ON PHASE DIFFERENCE, AND IMAGE PICK-UP APPARATUS INCLUDING THE SAME

(71) Applicant: LG INNOTEK CO., LTD., Seoul (KR)

(72) Inventors: Eun Sung Seo, Seoul (KR); Yu Kyeong Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 118 days.

(21) Appl. No.: 14/815,402

(22) Filed: Jul. 31, 2015

(65) Prior Publication Data

US 2016/0037103 A1   Feb. 4, 2016

(30) Foreign Application Priority Data

Aug. 4, 2014  (KR) .......................... 10-2014-0099676

(51) Int. Cl.
*H04N 5/232* (2006.01)
*H04N 5/335* (2011.01)
*H04N 5/369* (2011.01)
*H01L 27/146* (2006.01)

(52) U.S. Cl.
CPC ..... *H04N 5/3696* (2013.01); *H01L 27/14605* (2013.01); *H01L 27/14623* (2013.01); *H01L 27/14627* (2013.01); *H01L 27/14645* (2013.01); *H04N 5/23212* (2013.01)

(58) Field of Classification Search
CPC .. H04N 5/3696; H04N 5/23296; H04N 5/369; H04N 5/232; H01L 27/14623; H01L 27/14605; H01L 27/14627; H01L 27/14645

See application file for complete search history.

(56) References Cited

U.S. PATENT DOCUMENTS

| | | | |
|---|---|---|---|
| 2011/0085785 A1* | 4/2011 | Ishii ........................ | G03B 13/00 396/104 |
| 2011/0096211 A1* | 4/2011 | Oikawa .................. | G03B 13/36 348/273 |

(Continued)

FOREIGN PATENT DOCUMENTS

| | | |
|---|---|---|
| JP | 2000-156823 A | 6/2000 |
| JP | 2011-029932 A | 2/2011 |

*Primary Examiner* — Jason Flohre
*Assistant Examiner* — Selam Gebriel
(74) *Attorney, Agent, or Firm* — LRK Patent Law Firm (57) ABSTRACT

An image sensor includes phase difference detection pixels including first group pixels each having a first shield region deviated at one side and second group pixels each having a second shield region deviated at the other side, and image detection pixels arranged in a lattice pattern together with the phase difference detection pixels. The phase difference detection pixels include a first pixel group configured such that an area of the first shield region is equal to that of the second shield region, a second pixel group configured such that the area of the first shield region is equal to or greater than that of the second shield region, and a third pixel group configured such that the area of the first shield region is equal to or less than that of the second shield region.

16 Claims, 7 Drawing Sheets

(56) References Cited

U.S. PATENT DOCUMENTS

| | | | | |
|---|---|---|---|---|
| 2012/0044406 | A1* | 2/2012 | Shimoda | G02B 7/365 348/345 |
| 2013/0021521 | A1* | 1/2013 | Hamada | H04N 5/23212 348/360 |
| 2013/0194471 | A1* | 8/2013 | Yamashita | H04N 5/374 348/308 |
| 2014/0022614 | A1* | 1/2014 | Endo | H04N 5/23212 358/505 |
| 2014/0092220 | A1* | 4/2014 | Kawamura | H04N 9/045 348/49 |
| 2014/0327798 | A1* | 11/2014 | Takakusagi | H04N 9/045 348/273 |
| 2014/0347516 | A1* | 11/2014 | Sano | H04N 5/355 348/230.1 |

* cited by examiner

IMAGE SENSOR INCLUDING PHASE DIFFERENCE DETECTION PIXELS HAVING AUTO FOCUS ACCURACY BASED ON PHASE DIFFERENCE, AND IMAGE PICK-UP APPARATUS INCLUDING THE SAME

CROSS REFERENCE TO RELATED APPLICATION

This application claims priority under 35 U.S.C. § 119 to Korean Patent Application No. 10-2014-0099676, filed in Korea on Aug. 4, 2014, which is hereby incorporated in its entirety by reference as if fully set forth herein.

BACKGROUND OF THE INVENTION

1. Field of the Invention

Embodiments relate to an image sensor including phase difference detection pixels and an image pick-up apparatus including the same.

2. Description of Related Art

With the increase in demand for high-quality image acquisition technology in an image acquisition apparatus, such as a camera, an auto focus (AF) system has been increasingly applied to cameras for mobile phones or small-sized mobile devices as well as digital cameras and interchangeable lens cameras.

A phase difference detection type AF system or a contrast detection type AF system is mainly used as the AF system.

In the contrast detection type AF system, high frequency data are extracted from image data acquired by an image sensor, and AF control is performed to maximize the high frequency data. To this end, a signal processing circuit is required. However, an additional sensor or an optical system is not needed. Consequently, the AF system may be configured at relatively low cost. However, the contrast detection type AF system is slower and less accurate than the phase difference detection type AF system.

In the phase difference detection type AF system, light incident through a pick-up lens is pupil-divided into a pair of images, and a phase difference, which is an interval between the images, is detected to set the position of the pick-up lens, thereby detecting focus.

In the phase difference detection type AF system, a phase difference detection AF sensor may be provided separately from the pick-up lens, or phase difference detection pixels may be arranged in an image sensor.

In the phase difference detection type AF system, some regions of the phase difference detection pixels are shielded to receive a limited amount of incident light. In a case in which the shielded regions of the phase difference detection pixels are the same on the left and right, the quantities of light received from a pair of phase difference detection pixels having different shielding directions are different from each other for the phase difference detection pixels arranged at an outer region of the image sensor as compared with the central region of the image sensor.

AF accuracy based on phase difference is lowered due to the difference in quantity of incident light.

SUMMARY

Embodiments provide an image sensor including phase difference detection pixels having AF accuracy based on phase difference and an image pick-up apparatus including the same.

In one embodiment, an image sensor includes a plurality of phase difference detection pixels including first group pixels each having a first shield region deviated at one side and second group pixels each having a second shield region deviated at the other side, and a plurality of image detection pixels arranged in a lattice pattern together with the phase difference detection pixels, wherein the phase difference detection pixels include a first pixel group configured such that an area of the first shield region is equal to that of the second shield region, a second pixel group configured such that the area of the first shield region is equal to or greater than that of the second shield region, and a third pixel group configured such that the area of the first shield region is equal to or less than that of the second shield region.

The lattice pattern may have a plurality of Bayer arrangement type lattice units, and the phase difference detection pixels may be arranged in green regions of the lattice units.

The first group pixels may have the first shield regions in right regions of the phase difference detection pixels, and the second group pixels may have the second shield regions in left regions of the phase difference detection pixels.

The first pixel group may be arranged in a central region of the image sensor, and the second pixel group and the third pixel group may be arranged symmetrically with respect to the first pixel group.

A ratio in area of the first shield region to the second shield region of the second pixel group may be 5:5 to 7:3.

A ratio in area of the first shield region to the second shield region of the third pixel group may be 3:7 to 5:5.

A ratio in area of the first shield region to the second shield region of the second pixel group may gradually decrease toward a center of the image sensor.

A ratio in area of the first shield region to the second shield region of the third pixel group may gradually increase toward a center of the image sensor.

A ratio in area of the first shield region to the second shield region of a pixel group provided between the first pixel group and the second pixel group may be 5:5 to 6:4.

A ratio in area of the first shield region to the second shield region of a pixel group provided between the first pixel group and the third pixel group may be 4:6 to 5:5.

In another embodiment, an image pick-up apparatus includes an optical unit for receiving an optical signal, an image sensor for generating image information from the optical signal received from the optical unit, and an image processing unit for processing the image information, wherein the image sensor includes a plurality of phase difference detection pixels including first group pixels each having a first shield region deviated at one side and second group pixels each having a second shield region deviated at the other side, and a plurality of image detection pixels arranged in a lattice pattern together with the phase difference detection pixels, and the phase difference detection pixels includes a first pixel group configured such that an area of the first shield region is equal to that of the second shield region, a second pixel group configured such that the area of the first shield region is equal to or greater than that of the second shield region, and a third pixel group configured such that the area of the first shield region is equal to or less than that of the second shield region.

The lattice pattern may have a plurality of Bayer arrangement type lattice units, and the phase difference detection pixels may be arranged in green regions of the lattice units.

The first group pixels may have the first shield regions in right regions of the phase difference detection pixels, and the second group pixels may have the second shield regions in left regions of the phase difference detection pixels.

The first pixel group may be arranged in a central region of the image sensor, and the second pixel group and the third pixel group may be arranged symmetrically with respect to the first pixel group.

A ratio in area of the first shield region to the second shield region of the second pixel group may be 5:5 to 7:3.

A ratio in area of the first shield region to the second shield region of the third pixel group may be 3:7 to 5:5.

A ratio in area of the first shield region to the second shield region of the second pixel group may gradually decrease toward a center of the image sensor.

A ratio in area of the first shield region to the second shield region of the third pixel group may gradually increase toward a center of the image sensor.

A ratio in area of the first shield region to the second shield region of a pixel group provided between the first pixel group and the second pixel group may be 5:5 to 6:4.

A ratio in area of the first shield region to the second shield region of a pixel group provided between the first pixel group and the third pixel group may be 4.6 to 5:5.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Hereinafter, embodiments will be described with reference to the annexed drawings.

Relational terms, such as 'first' and 'second' and 'upper part' and 'lower part', are used only to distinguish between one subject or element and another subject and element without necessarily requiring or involving any physical or logical relationship or sequence between such subjects or elements.

In the drawings, the thicknesses or sizes of respective layers are exaggerated, omitted, or schematically illustrated for convenience and clarity of description. Further, the sizes of the respective elements do not denote the actual sizes thereof.

Figure 1:
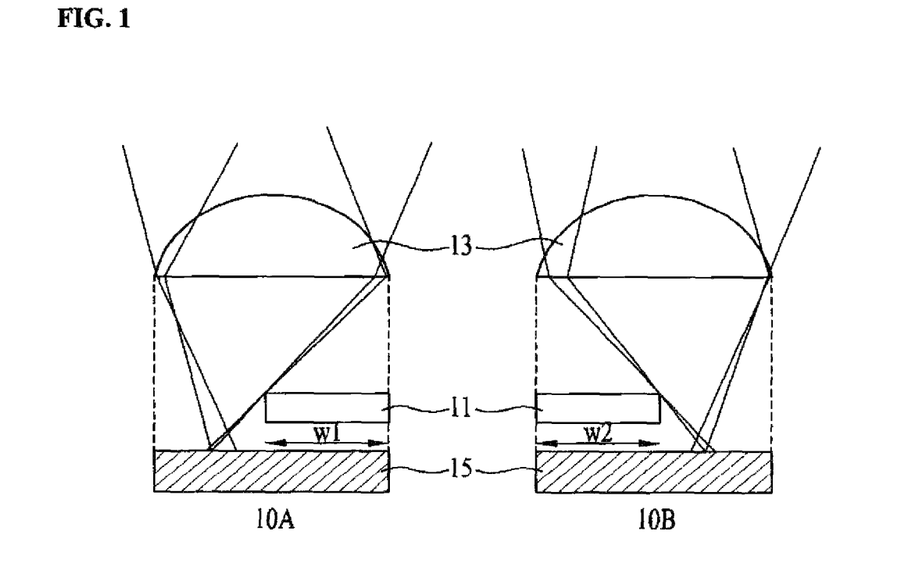
FIG. 1 is a sectional view schematically showing configuration of phase difference detection pixels.

FIG. 1 is a sectional view schematically showing configuration of phase difference detection pixels 10A and 10B.

The phase difference detection pixels 10A and 10B each may include a mask layer 11, a micro lens 13, and a photodiode 15.

The mask layer 11 may form a shield region of each phase difference detection pixel.

The mask layer 11 may be embodied by a metal mask. The shield region may be distinguished from an opening, through which light is incident, by the mask layer 11. For example, the quantity of light incident upon an image sensor may be adjusted based on the area shielded by the mask layer 11.

The micro lens 13 may concentrate an incident optical signal on a center portion of each phase difference detection pixel and transmit the optical signal to the photodiode 15. The position of the micro lens 13 relative to the photodiode 15 may be changed so as to concentrate the incident optical signal on each phase difference detection pixel.

The photodiode 15 may convert the incident optical signal into an electrical signal.

The phase difference detection pixels may include a first group pixel 10A having a first shield region deviated at one side and a second group pixel 10B having a second shield region deviated at the other side. For example, the first shield region and the second shield region may be deviated in opposite directions.

As briefly shown in FIG. 1, light incident upon the first group pixel 10A and the second group pixel 10B is concentrated through the micro lens, the concentrated light transmits optical signals to the respective photodiodes through light-receiving regions at which the mask layers are not arranged, and a pair of images for phase difference detection is obtained from the photodiodes.

Figure 2:
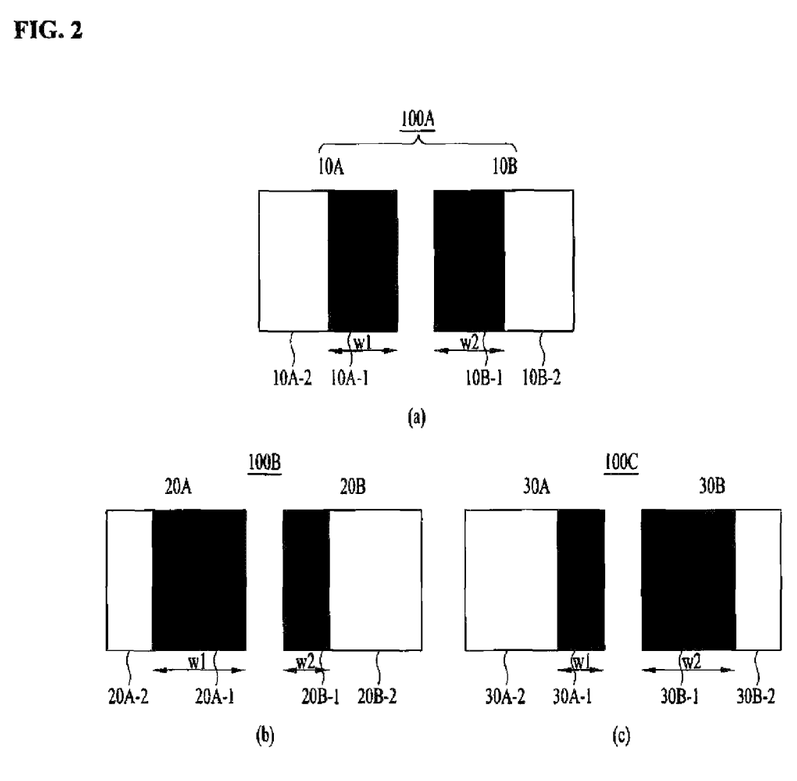
FIG. 2 is a view schematically showing upper surfaces of embodiments of phase difference detection pixels.

FIG. 2 is a view showing embodiments of phase difference detection pixels.

FIG. 2 briefly shows upper surfaces of the phase difference detection pixels. First group pixels 10A, 20A, and 30A may each have a first shield region located at the right side of a corresponding one of the phase difference detection pixels, and second group pixels 10B, 20B, and 30B may each have a second shield region located at the left side of a corresponding one of the phase difference detection pixels.

FIG. 2(a) to FIG. 2(c) briefly show embodiments of phase difference detection pixels having different area ratios of the shield regions of the first group pixels 10A, 20A, and 30A and the second group pixels 10B, 20B, and 30B.

FIG. 2(a) shows a first pixel group 100A constituted by phase difference detection pixels configured such that the area of a first shield region 10A-1 of the first group pixel 10A is equal to that of a second shield region 10B-1 of the second group pixel 10B.

For example, in a case in which lengths of the phase difference detection pixels constituting the first pixel group 100A in a column direction are the same, a width w1 of the first shield region 10A-1 of the first group pixel 10A in a row direction may be equal to a width w2 of the second shield region 10B-1 of the second group pixel 10B in the row direction.

FIG. 2(b) is a view showing phase difference detection pixels constituting a second pixel group 100B. For the second pixel group 100B, the area of a first shield region 20A-1 of the first group pixel 20A may be equal to or greater than that of a second shield region 20B-1 of the second group pixel 20B.

FIG. 2(c) is view showing phase difference detection pixels constituting a third pixel group 100C. For the third pixel group 100C, the area of a first shield region 30A-1 of the first group pixel 30A may be equal to or less than that of a second shield region 30B-1 of the second group pixel 30B.

Hereinafter, embodiments of an image sensor 200 will be described with reference to the drawings. However, the number of pixels included in the image sensor is not limited to that shown in the drawings. The total number of pixels included in the image sensor may be less than or greater than that shown in the drawings.

Figure 3:
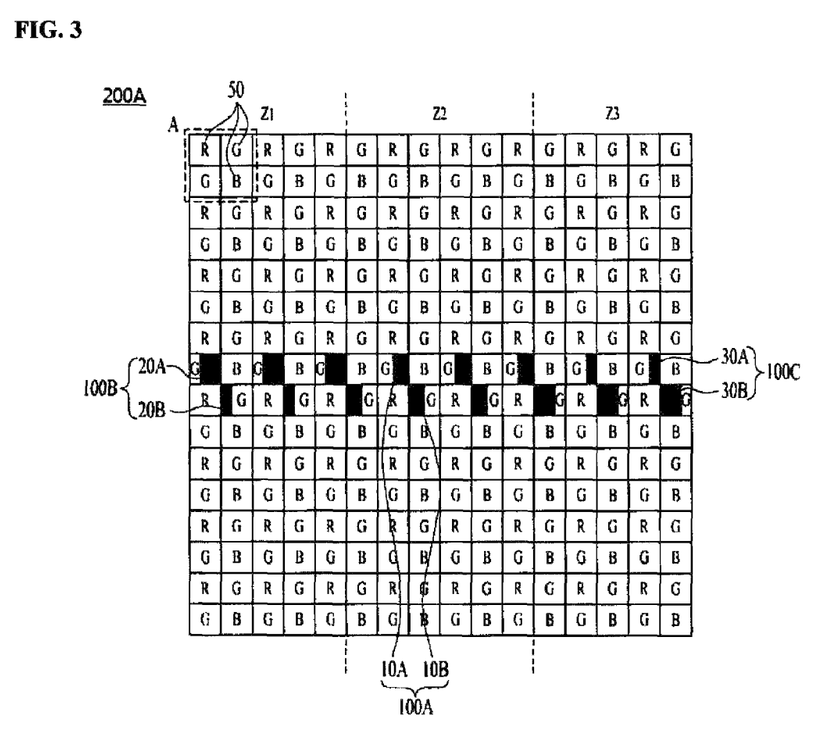
FIG. 3 is a view showing an image sensor according to an embodiment.

FIG. 3 is a view showing an image sensor 200A according to an embodiment.

The image sensor 200A may include a plurality of phase difference detection pixels 100A, 100B, and 100C and a plurality of image detection pixels 50.

The phase difference detection pixels may include first group pixels 10A, 20A, and 30A each having a first shield region deviated at one side and second group pixels 10B, 20B, and 30B each having a second shield region deviated at the other side.

The phase difference detection pixels may include the phase difference detection pixels 100A, 100B, and 100C, which are the phase difference detection pixels shown in FIG. 2.

The image detection pixels 50 may be color pixels. The image detection pixels 50 may constitute a plurality of lattice units A. The lattice units A may be arranged to constitute a lattice pattern. In addition, the phase difference detection pixels 100A, 100B, and 100C and the image detection pixels 50 may constitute the lattice pattern together.

In a case in which the image detection pixels 50 are color pixels, the color pixels may be red, green, and blue. However, the color pixels are not limited to the illustrated colors.

In FIG. 3, portions indicated by R, G, and B indicate red, green, and blue, respectively.

Each lattice unit A may be a Bayer arrangement in which four pixels are arranged in a 2×2 matrix, and the phase difference detection pixels 100A, 100B, and 100C may be arranged on G pixels in the lattice units.

FIG. 3 shows a case in which each lattice unit A has a 2×2 matrix. However, the disclosure is not limited thereto. Each lattice unit A constituting the lattice pattern may have a 3×3 matrix or a 4×4 matrix.

The image sensor including the lattice units A may constitute a lattice pattern having pixels arranged in an n×m matrix, where n and m are natural numbers, and n and m may be equal to or different from each other.

The image sensor 200A may include a photoelectric element for converting an input optical signal into an electrical signal.

The image sensor 200A may convert an optical signal input from the outside into an electrical signal to output image information. In addition, the image sensor 200A may convert an input analog image signal into image information as digital data. In a case in which the image sensor 200A includes color pixels, the image sensor 200A may calculate color information from an input optical signal.

In the embodiment shown in FIG. 3, the first pixel group 100A may be arranged in a central region of the image sensor 200A, and the second pixel group 100B and the third pixel group 100C may be arranged symmetrically with respect to the first pixel group 100A.

For example, in a case in which the image sensor 200A is divided into three regions in the row direction, the first pixel group 100A may be arranged in a central region Z2 of the image sensor 200A, the second pixel group 100B may be arranged in a region Z1 corresponding to the left side of the central region Z2, and the third pixel group 100C may be arranged in a region Z3 corresponding to the right side of the central region Z2.

In FIG. 3, the three divided regions Z1, Z2, and Z3 of the image sensor may have the same number of pixels. In addition, the number of the pixels in the region Z2 may be equal to that of the pixels in the region Z3, and the number of the pixels in the region Z1 may be different from that of the pixels in the region Z2 or Z3.

In the embodiment of FIG. 3, a ratio in area of the first shield region 20A-1 to the second shield region 20B-1 of the second pixel group 100B may be 5:5 to 7:3.

For example, in a case in which lengths of the phase difference detection pixels constituting the second pixel group 100B in the column direction are the same, on the assumption that the width of first shield region 20A-1 is w1, and the width of the second shield region 20B-1 is w2, a ratio (w1:w2) in width of the shield regions of the phase difference detection pixels 20A and 20B constituting the second pixel group 100B may be 5:5 to 7:3.

Since the region Z1 of the image sensor 200A is deviated from the central region Z2 to the left side, optical signals incident from the right side of the phase difference detection pixels at the central region of the image sensor may be larger than those incident from the left side of the phase difference detection pixels.

Consequently, in a case in which the phase difference detection pixels having the same area of the first shield region 10A-1 to the second shield region 10B-1 are arranged in the region Z1 as in the first pixel group 100A, an optical signal incident from the first group pixel 10A and an optical signal incident from the second group pixel 10B may be different from each other in terms of intensity of the optical signal.

On the other hand, in a case in which the second pixel group 100B is arranged in the region Z1, shielding of light incident from the left side at which the quantity of incident light is relatively small may be reduced, and the quantity of light incident from the right side at which the quantity of incident light is relatively large may be reduced, since the area of the shield region of the second group pixel 20B is less than that of the shield region of the first group pixel 20A. Consequently, the quantities of light incident from a pair of phase difference detection pixels of the second pixel group 100B may approximate each other, whereby phase difference detection is accurately performed.

In a case in which the area of the first shield region 20A-1 of the second pixel group 100B is less than that of the second shield region 20B-1, the difference in quantity of light incident upon the first group pixel 20A and the second first group pixel 20B is increased, whereby accuracy in phase difference detection may be decreased.

In addition, in a case in which the ratio in area of the first shield region 20A-1 to the second shield region 20B-1 is greater than 7:3, the quantity of light shielded at the first group pixel 20A is excessively increased with the result that it is not possible to secure the quantity of light necessary to obtain an image for phase difference detection.

In the embodiment of FIG. 3, a ratio in area of the first shield region 30A-1 to the second shield region 30B-1 of the third pixel group 100C may be 3:7 to 5:5.

Since the region Z3 of the image sensor 200A is deviated from the central region Z2 to the right side, optical signals incident from the left side of the phase difference detection pixels may be larger than those incident from the right side of the phase difference detection pixels.

Consequently, in a case in which the phase difference detection pixels of the first pixel group 100A having the same area of the shield regions are arranged in the region Z3, the quantity of light incident from the first group pixel 10A may be different from that of light incident from the second group pixel 10B. As a result, it is not possible to accurately measure a phase difference from images for phase difference detection obtained from the two pixels, whereby AF accuracy may be decreased.

In a case in which the third pixel group 100C is arranged in the region Z3, therefore, the area of the first shield region 30A-1 is less than that of the second shield region 30B-1. Consequently, the quantity of light incident from the right side is increased such that quantities of light incident from a pair of images used for phase difference detection upon the photodiodes are approximated to each other, whereby phase difference detection is accurately performed.

However, in a case in which the ratio in area of the first shield region 30A-1 to the second shield region 30B-1 of the third pixel group 100C is less than 3:7, i.e. in a case in which the area of the shield region of the second group pixel 30B is greater than 70% the entire area of the pixel, the quantity of light shielded at the phase difference detection pixel is excessively increased with the result that the quantity of light received by the photodiode may be insufficient to obtain an image for phase difference detection.

In addition, in a case in which the ratio in area of the first shield region 30A-1 to the second shield region 30B-1 is greater than 5:5, the difference in quantity of light incident upon the first group pixel 20A and the second first group pixel 20B is increased, whereby accuracy in phase difference detection may be decreased.

Figure 4A:
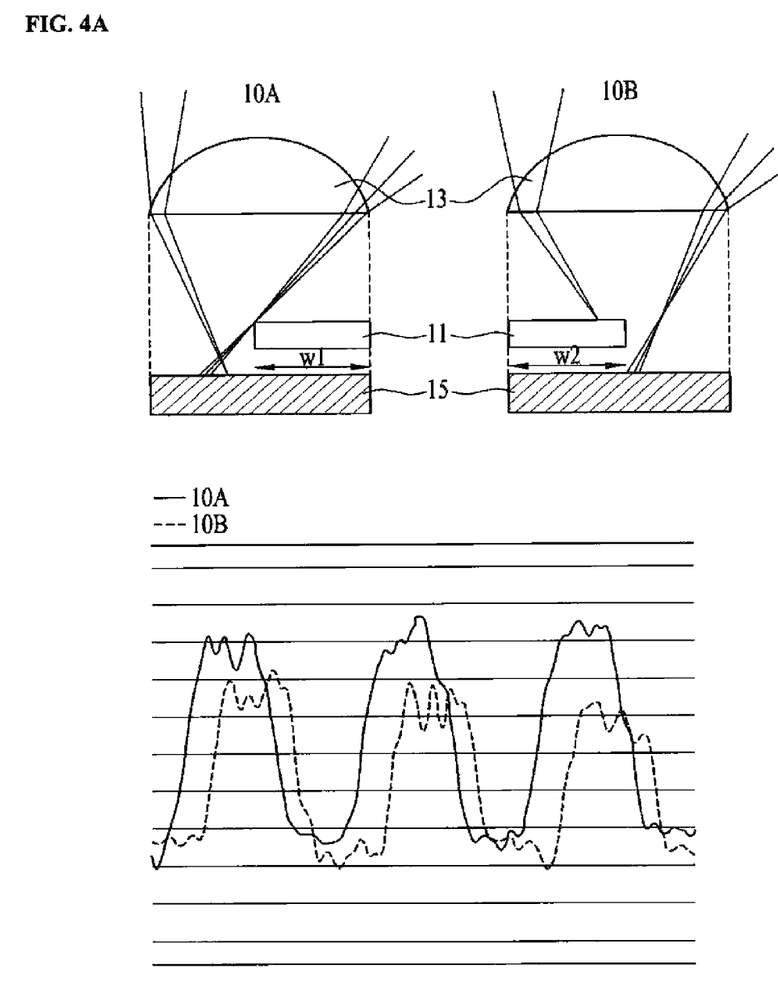
FIGS. 4A and 4B are views showing comparison between phase difference detection pixels in terms of the quantity of received light based on an area ratio of a shield region.
Figure 4B:
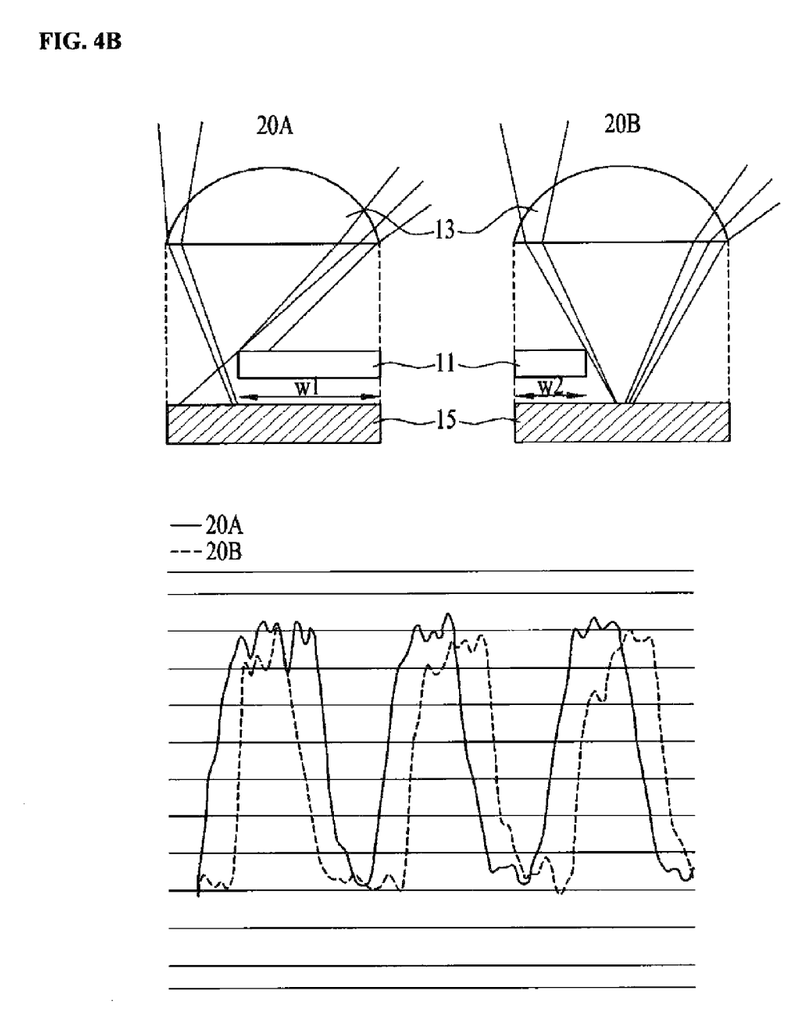

FIGS. 4A and 4B are views showing paths of light incident upon the phase difference detection pixels in the region Z2 and quantities of the incident light.

FIG. 4A snows a case in which the phase difference detection pixels constituting the first pixel group 100A are arranged. The micro lenses may collect incident light on the centers of the phase difference detection pixels. In the region Z2, however, the micro lenses may each have an asymmetric light incidence path along which the quantity of light incident from the right side of the phase difference detection pixel is large, and the quantity of light incident from the left side of the phase difference detection pixel is small.

In a case in which such asymmetric light is incident, as shown in a graph of FIG. 4A, the quantity of light incident upon the first group pixel 10A may be different from that of light incident upon the second group pixel 10B. When optical information incident upon a pair of phase difference detection pixels 10A and 10B is compared to detect a phase difference, therefore, it is not possible to accurately detect a phase difference value due to the difference in quantity of light.

On the other hand, FIG. 4B is a view showing paths and quantities of incident light when using the image sensor of the embodiment to which the second pixel group is applied.

For the second pixel group 100B, the area of the shield region of the first group pixel 20A is larger than that of the shield region of the second group pixel 20B. Consequently, light incident from the right upper portion of the phase difference detection pixel of the second pixel group 100B having a relatively large quantity of incident light is partially shielded by the first group pixel 20A, and light incident from the left upper portion has a reduced quantity of light shielded by the second group pixel 20B.

In a case in which the second pixel group is arranged in the region Z1 as shown in a graph of FIG. 4B, therefore, the quantities of light incident from the first group pixel 20A and the second group pixel 20B and reaching the photodiodes may approximate each other, whereby accuracy in phase difference detection may be increased.

In addition, although not shown, in a case in which the third pixel group 100C is arranged in the region Z3 of the image sensor 200A, the area of the shield region of the second group pixel 30B is larger than that of the shield region of the first group pixel 30A. Consequently, light incident from the left upper portion of the phase difference detection pixel having a relatively large quantity of incident light is partially shielded by the second group pixel 30B, and light incident from the right upper portion has a reduced quantity of light shielded by the first group pixel 30A.

In the region Z3, therefore, the quantities of light incident from the first group pixel 30A and the second group pixel 30B may approximate each other, whereby accuracy in phase difference detection may be increased.

Figure 5:
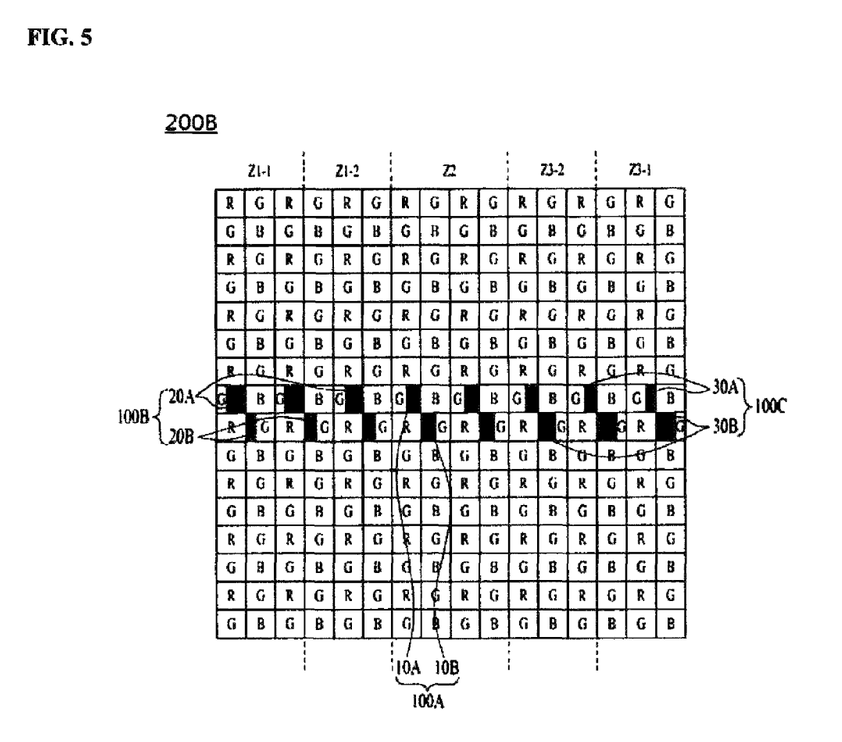
FIG. 5 is a view showing an image sensor according to an embodiment.

FIG. 5 is a view showing an embodiment of an image sensor 200B.

Hereinafter, the image sensor 200B will be described based on difference from FIG. 3.

In the image sensor 200B of the embodiment shown in FIG. 5, a ratio in area of a first shield region 20A-1 to a second shield region 20B-1 of a second pixel group 100B may gradually decrease toward the center of the image sensor.

In addition, in the image sensor, a ratio in area of a first shield region 30A-1 to a second shield region 30B-1 of a third pixel group 100C may gradually increase toward the center of the image sensor.

For example, in a case in which the image sensor 200B is divided into five regions in a row direction as in the example shown in FIG. 5, phase difference detection pixels of a first pixel group 100A may be arranged in a central region Z2, the second pixel group 100B may be arranged in left regions Z1-1 and Z1-2, and the third pixel group 100c may be arranged in right regions Z3-1 and Z3-2.

In addition, the area of a first shield region 20A-1 of a first group pixel 20A of the second pixel group 100B arranged in the region Z1-1 may be greater than that of a first shield region 20A-1 of a first group pixel 20A of the second pixel group 100B arranged in the region Z1-2.

For example, a ratio in area of a shield region of a first group pixel 20A to a shield region of a second group pixel 20B in the region Z1-1 may be 7:3, and a ratio in area of a shield region of a first group pixel to a shield region of a second group pixel in the region Z1-2 may be 6:4.

In the embodiment of FIG. 5, the area of a first shield region 30A-1 of a first group pixel 30A of the third pixel group 100C arranged in the region Z3-1 may be less than that of a shield region of a first group pixel 30A of the third pixel group 100C arranged in the region Z3-2.

For example, a ratio in area of a shield region of a first group pixel 30A to a shield region of a second group pixel 30B of the third pixel group 100C arranged in the region Z3-1 may be 3:7, and a ratio in area of a shield region of a first group pixel 30A to a shield region of a second group pixel 30B in the region Z3-2 may be 4:6.

In addition, the ratio in area of the shield region of the first group pixel 20A to the shield region of the second group pixel 20B may gradually increase from the center of the image sensor 200B to the left side. In contrast, the ratio in area of the shield region of the first group pixel 30A to the shield region of the second group pixel 30B may gradually decrease from the center of the image sensor 200B to the right side.

In the embodiment of FIG. 5, the second pixel group 100B and the third pixel group 100C may be arranged symmetrically with respect to the first pixel group 100A.

For example, the numbers of image detection pixels and phase difference detection pixels in the regions Z1-1 and Z3-1, which are outer regions of the image sensor, may be equal to each other. In addition, the numbers of image detection pixels and phase difference detection pixels in the regions Z1-2 and Z3-2, which are between the outer regions and the center region Z2 of the image sensor, may be equal to each other.

In FIGS. 3 and 5, the first group pixels 10A, 20A, and 30A of the phase difference detection pixels 100A, 100B, and 100C are arranged in the same row, and the second group pixels 10B, 20B, and 30B are arranged in the row direction in a row neighboring to the row in which the first group pixels 10A, 20A, and 30A are arranged.

In addition, although not shown, the phase difference detection pixels 100A, 100B, and 100C in the image sensors 200A and 200B may be arranged, for example, such that the first group pixels 10A, 20A, and 30A and the second group pixels 10B, 20B, and 30B are alternately arranged in the same row. In addition, the row in which the first group pixels 10A, 20A are arranged and the row in which the second group pixels 10B, 20B, and 30B are arranged may be spaced apart from each other. However, the disclosure is not limited thereto.

For the image sensors 200A and 200B of the embodiments as described above, each image sensor is divided into regions, and phase difference detection pixels having a different ratio in area of the first shield region to the second shield region are arranged in the regions. As a result, the quantities of light incident upon a pair of phase difference detection pixels may approximate each other even in the outer region of the image sensor. Consequently, it is possible to easily detect a phase difference, thereby improving AF accuracy.

Hereinafter, an image pick-up apparatus including the image sensor 200A or 200B will be described with reference to the accompanying drawings. However, the disclosure is not limited thereto. That is, the image sensors 200A and 200B may be variously used.

Figure 6:
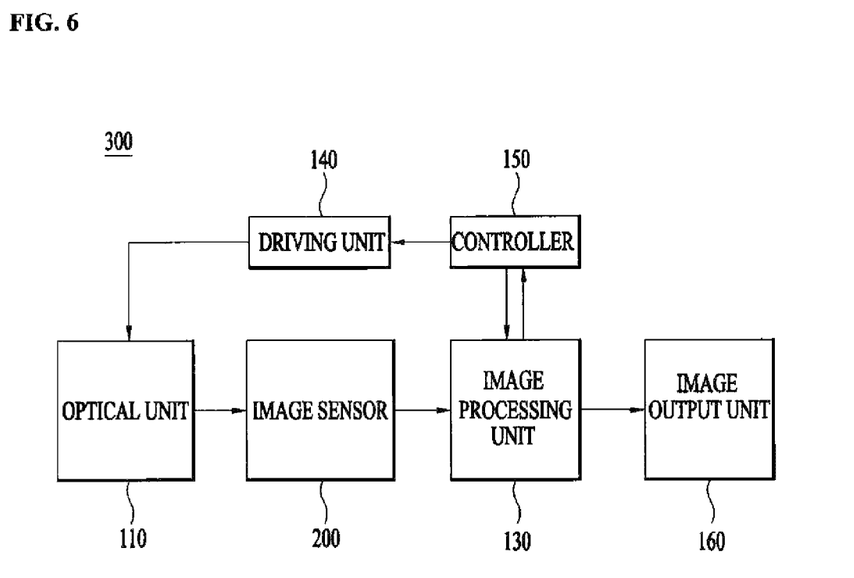
FIG. 6 is a block diagram of an image pick-up apparatus according to an embodiment.

FIG. 6 is a block diagram showing schematic configuration of an image pick-up apparatus 300 according to an embodiment.

The image pick-up apparatus 300 may include an optical unit 110, an image sensor 200, an image processing unit 130, a driving unit 140, a controller 150, and an image output unit 160.

The optical unit 110 may include a lens and a lens moving unit. In order to acquire an image for a subject, the optical unit 110 may receive light incident from the outside and output the received light to the image sensor 200.

The optical unit 110 may include a plurality of lenses, such as a focus lens and a zoom lens. The positions of the lenses may be adjusted by the lens moving unit.

Optical information output from the optical unit 110 may be transmitted to the image sensor 200.

The image sensor 200 may be any one of the image sensors 200A and 200B of the embodiments as described above. The image sensor 200 may receive the optical information of the subject incident through the lens of the optical unit 110 and convert the received optical information into an electrical signal. The image sensor 200 may be a charge-coupled device (CCD) sensor or a complementary metal-oxide-semiconductor (CMOS) sensor.

The image processing unit 130 may generate image information based on the electrical signal received from the image sensor 200 and transmit the generated image information to the image output unit 160, which displays the image information as an image.

For example, the image processing unit 130 may generate image information of a picked-up image from electrical signals of image detection pixels 50 received from the image sensor 200, and generate image information for focus adjustment based on electrical signals of phase difference detection pixels 100A, 100B, and 100C.

In addition, the image processing unit 130 may obtain information for preparing a depth map as well as two-dimensional image information from the electrical signals of the received phase difference detection pixels 100A, 100B, and 100C. Three-dimensional image information as well as the two-dimensional image information may be calculated from the information regarding the depth map.

The image information for focus adjustment generated by the image processing unit 130 may be transmitted to the controller 150.

The controller 150 may control overall operation of the image pick-up apparatus. The controller 150 may enable the driving unit 140 for driving the optical unit 110 and the image processing unit 130.

The controller 150 may control the optical unit 110 to control an input optical signal. The input optical signal may be converted into an electrical signal by the image sensor 200, and the electrical signal may be transmitted to the image processing unit 130. The image information for focus adjustment processed and output by the image processing unit 130 may be fed back to the controller 150, which may calculate the quantity of focus deviation.

The controller 150 may calculate the quantity movement of the optical unit 110 that is necessary for phase difference detection type AF adjustment based on the calculated quantity of focus deviation. Information regarding the calculated quantity of movement of the optical unit 110 may be transmitted from the controller 150 to the driving unit 140. As a result, the optical unit 110 may be adjusted to perform phase difference detection type AF control.

The driving unit 140 may move the lens of the optical unit 110 based on the information regarding the quantity of movement of the lens received from the controller 150.

The image output unit 160 may display the image information received from the image processing unit 130. The image output unit 160 may provide visual image information to a user. To this end, the image output unit 160 may include a display unit, such as a liquid crystal display (LCD) panel or an organic light-emitting diode (OLED) panel.

The image processing unit 130 of the image pick-up apparatus 300 may process image information of a plurality of phase difference detection pixels 100A, 100B, and 100C with image information of a plurality of image detection pixels 50 arranged so as to surround the phase difference detection pixels. That is, the image information of the phase difference detection pixels 100A, 100B, and 100C may be corrected and processed using the image information of neighboring image detection pixels 50.

As is apparent from the above description, in an image sensor according to an embodiment, a ratio in area of shield regions of phase difference detection pixels arranged per region of the image sensor may be changed, whereby it is possible to improve accuracy in phase difference detection type auto focus (AF) adjustment over all the regions of the image sensor.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
a plurality of phase difference detection pixels comprising first group pixels each having a first shield region deviated at one side and second group pixels each having a second shield region deviated at the other side; and
a plurality of image detection pixels arranged in a lattice pattern together with the plurality of phase difference detection pixels,
wherein the plurality of phase difference detection pixels comprises:
a first pixel group configured such that an area of the first shield region is equal to that of the second shield region;
a second pixel group configured such that the area of the first shield region is greater than that of the second shield region; and
a third pixel group configured such that the area of the first shield region is less than that of the second shield region,
wherein the first pixel group is arranged in a central region of the image sensor, and the second pixel group and the third pixel group are arranged symmetrically with respect to the first pixel group, and
wherein a ratio in area of the first shield region to the second shield region of the third pixel group is between 3:7 and 5:5.

2. The image sensor according to claim 1, wherein the lattice pattern has a plurality of Bayer arrangement type lattice units, and the phase difference detection pixels are arranged in green regions of the lattice units.

3. The image sensor according to claim 1, wherein the first group pixels have the first shield regions in right regions of the phase difference detection pixels, and the second group pixels have the second shield regions in left regions of the phase difference detection pixels.

4. The image sensor according to claim 1, wherein a ratio in area of the first shield region to the second shield region of the second pixel group is between 5:5 and 7:3.

5. The image sensor according to claim 4, wherein the ratio in area of the first shield region to the second shield region of the second pixel group gradually decreases toward a center of the image sensor.

6. The image sensor according to claim 1, wherein the ratio in area of the first shield region to the second shield region of the third pixel group gradually increases toward a center of the image sensor.

7. The image sensor according to claim 5, wherein the ratio in area of the first shield region to the second shield region of a pixel group provided between the first pixel group and the second pixel group is between 5:5 and 6:4.

8. The image sensor according to claim 6, wherein the ratio in area of the first shield region to the second shield region of a pixel group provided between the first pixel group and the third pixel group is between 4:6 and 5:5.

9. An image pick-up apparatus comprising:
an optical unit for receiving an optical signal;
an image sensor for generating image information from the optical signal received from the optical unit; and
an image processing unit for processing the image information,
wherein the image sensor comprises:
a plurality of phase difference detection pixels comprising first group pixels each having a first shield region deviated at one side and second group pixels each having a second shield region deviated at the other side; and
a plurality of image detection pixels arranged in a lattice pattern together with the plurality of phase difference detection pixels,
wherein the plurality of phase difference detection pixels comprises:
a first pixel group configured such that an area of the first shield region is equal to that of the second shield region;
a second pixel group configured such that the area of the first shield region is greater than that of the second shield region; and
a third pixel group configured such that the area of the first shield region is less than that of the second shield region,
wherein the first pixel group is arranged in a central region of the image sensor, and the second pixel group and the third pixel group are arranged symmetrically with respect to the first pixel group, and
wherein a ratio in area of the first shield region to the second shield region of the third pixel group is between 3:7 and 5:5.

10. The image pick-up apparatus according to claim 9, wherein the lattice pattern has a plurality of Bayer arrangement type lattice units, and the phase difference detection pixels are arranged in green regions of the lattice units.

11. The image pick-up apparatus according to claim 9, wherein the first group pixels have the first shield regions in right regions of the phase difference detection pixels, and the second group pixels have the second shield regions in left regions of the phase difference detection pixels.

12. The image pick-up apparatus according to claim 9, wherein a ratio in area of the first shield region to the second shield region of the second pixel group is between 5:5 and 7:3.

13. The image pick-up apparatus according to claim 12, wherein the ratio in area of the first shield region to the second shield region of the second pixel group gradually decreases toward a center of the image sensor.

14. The image pick-up apparatus according to claim 9, wherein the ratio in area of the first shield region to the second shield region of the third pixel group gradually increases toward a center of the image sensor.

15. The image pick-up apparatus according to claim 13, wherein the ratio in area of the first shield region to the second shield region of a pixel group provided between the first pixel group and the second pixel group is between 5:5 and 6:4.

16. The image pick-up apparatus according to claim 14, wherein the ratio in area of the first shield region to the second shield region of a pixel group provided between the first pixel group and the third pixel group is between 4:6 and 5:5.

* * * * *